United States Patent
Cook et al.

(10) Patent No.: US 6,542,035 B2
(45) Date of Patent: Apr. 1, 2003

(54) MODULAR HIGH POWER SOLID STATE AMPLIFIER

(75) Inventors: Dean L. Cook, Mesa, AZ (US); Michael R. Lyons, Tempe, AZ (US); John Martin Peitz, Mesa, AZ (US); Edwin Jack Stanfield, Queencreek, AZ (US)

(73) Assignee: U.S. Monolithics, L.L.C., Chandler, AZ (US)

( * ) Notice: Subject to any disclaimer, the term of this patent is extended or adjusted under 35 U.S.C. 154(b) by 132 days.

(21) Appl. No.: 09/750,927

(22) Filed: Dec. 28, 2000

(65) Prior Publication Data

US 2002/0084852 A1 Jul. 4, 2002

(51) Int. Cl.⁷ .............................. H03F 3/60; H03F 1/00; H03F 3/68; H03F 3/14
(52) U.S. Cl. .......................... 330/286; 330/53; 330/66; 330/124 R; 330/307
(58) Field of Search .............................. 330/53, 65, 66, 330/124 R, 286, 295, 307

(56) References Cited

U.S. PATENT DOCUMENTS

| | | | | | |
|---|---|---|---|---|---|
| 4,641,106 | A | * | 2/1987 | Belohoubek et al. | 330/286 |
| 5,136,300 | A | * | 8/1992 | Clarke et al. | 342/175 |
| 5,218,322 | A | * | 6/1993 | Allison et al. | 330/286 |
| 5,994,965 | A | * | 11/1999 | Davis et al. | 330/279 |
| 6,160,454 | A | | 12/2000 | Buer et al. | |

* cited by examiner

Primary Examiner—Patricia T. Nguyen
(74) Attorney, Agent, or Firm—Snell & Wilmer, L.L.P.

(57) ABSTRACT

A modular high power solid state amplifier and method of assembly, manufacture and use are herein disclosed. The high power amplifier includes a number of amplifiers, a DC board having flexible interconnects, a RF cover including an interlocking RF input, a RF board, a chassis, and a top cover; thereby providing an encased stand-alone solid state amplifier. The solid state components, angled designs, and piggyback topology of the invention provide a compact, efficient, integrated high power amplifier device.

26 Claims, 3 Drawing Sheets

MODULAR HIGH POWER SOLID STATE AMPLIFIER

FIELD OF THE INVENTION

The present invention relates generally to amplifiers and, in particular, to a modular high power solid state amplifier.

BACKGROUND OF THE INVENTION

Power outputs from individual amplifiers or amplifier devices are often combined to achieve a higher output power. The power output from one amplifier is combined with the power output from another amplifier and so on until the desired level of output power is reached.

There is some loss associated with combining multiple amplifiers due to the splitting and combining circuitry. This loss should be considered when determining the desired output power.

There are power limit constraints on solid state amplifiers. For example, due to combiner losses and device output power, a low cost, conventional solid state power amplifier can only achieve a few watts. For high power applications (e.g., over 10 watts), typically only tube amplifiers are available and not solid state devices. Moreover, even if solid state electronics were available for high power amplifiers, current assembly techniques require the size of the power amplifier to be too large and costly.

There are numerous problems associated with current power combining methods. Power combining requires the phase and amplitude of the combined signals to be closely matched. High frequency power amplifiers typically require precise, labor-intensive hand tuning to set the phase for each individual amplifier, thereby increasing labor and/or testing costs. Moreover, hand tuning the power amplifier increases manufacturing difficulty.

The assembly of each power amplifier is often complicated and time consuming. For example, RF (radio frequency) power amplifiers typically require a DC (direct current) feed to each individual amplifier. The DC must be routed around the RF paths channeling RF to each individual amplifier on a RF board. In the past, small wires (jumper wires) have been used to "jump over" the RF paths and deliver the DC to the amplifiers. Individually bonding the DC wires to the RF board is time consuming. Additionally, the fragile wires are very thin and susceptible to breakage; thus increasing the risk of amplifier breakdown. Moreover, the DC component is not integrated with the power amplifier into a single stand-alone package, but rather, the DC component is built into the RF component.

SUMMARY OF THE INVENTION

The various aspects of the present invention address the problems outlined above and provide a method and apparatus for an improved high power amplifier. A modular solid state high power amplifier is herein disclosed having a DC component and a RF component coupled to at least one gain device, and a suitable signal isolation layer between the two components.

The solid state components, angled configurations, and piggyback topology of the invention provide a compact and efficient integrated amplifier device and method of assembly, manufacture, and use.

BRIEF DESCRIPTION OF THE DRAWINGS

These and other features, aspects and advantages of the present invention will become better understood with reference to the following description, appending claims, and accompanying drawings where:

DETAILED DESCRIPTION OF EXEMPLARY EMBODIMENTS

Various embodiments of the present invention relate to an improved method of assembly for a solid state power amplifier. The power amplifier structure is particularly suited for use in high power applications in connection with MMIC (monolithic microwave integrated circuit) technology. As a result, the exemplary embodiments of the present invention are conveniently described in that context. It should be recognized however, that such description and drawings are not intended as a limitation on the use or applicability of the present invention, but rather, are provided merely to discuss one possible application. Accordingly, various other amplifiers may be equally suited for use in conjunction with the invention for a wide array of applications and systems, e.g., test amplifiers, customer premises equipment for LMDS, and satellite systems.

Although the high power amplifier disclosed herein may be suitable for mobile communication in a variety of applications, the present invention may be conveniently described with reference to commercial satellites systems or terrestrial point to multi-point communication systems, and more particularly to ground based Ka-band transmitters operating between about 26.5 GHz and 32 GHz.

An improved high power solid state amplifier and method of assembly is herein provided. For example, operating at a frequency of about 27 to 30 GHz, a single (integrated) module power amplifier in accordance with the invention can achieve a range of power outputs between about 10 to 14 watts. The solid state components, angled designs, and piggyback topology of the invention provide a small, highly efficient, integrated amplifier device.

Figure 1:
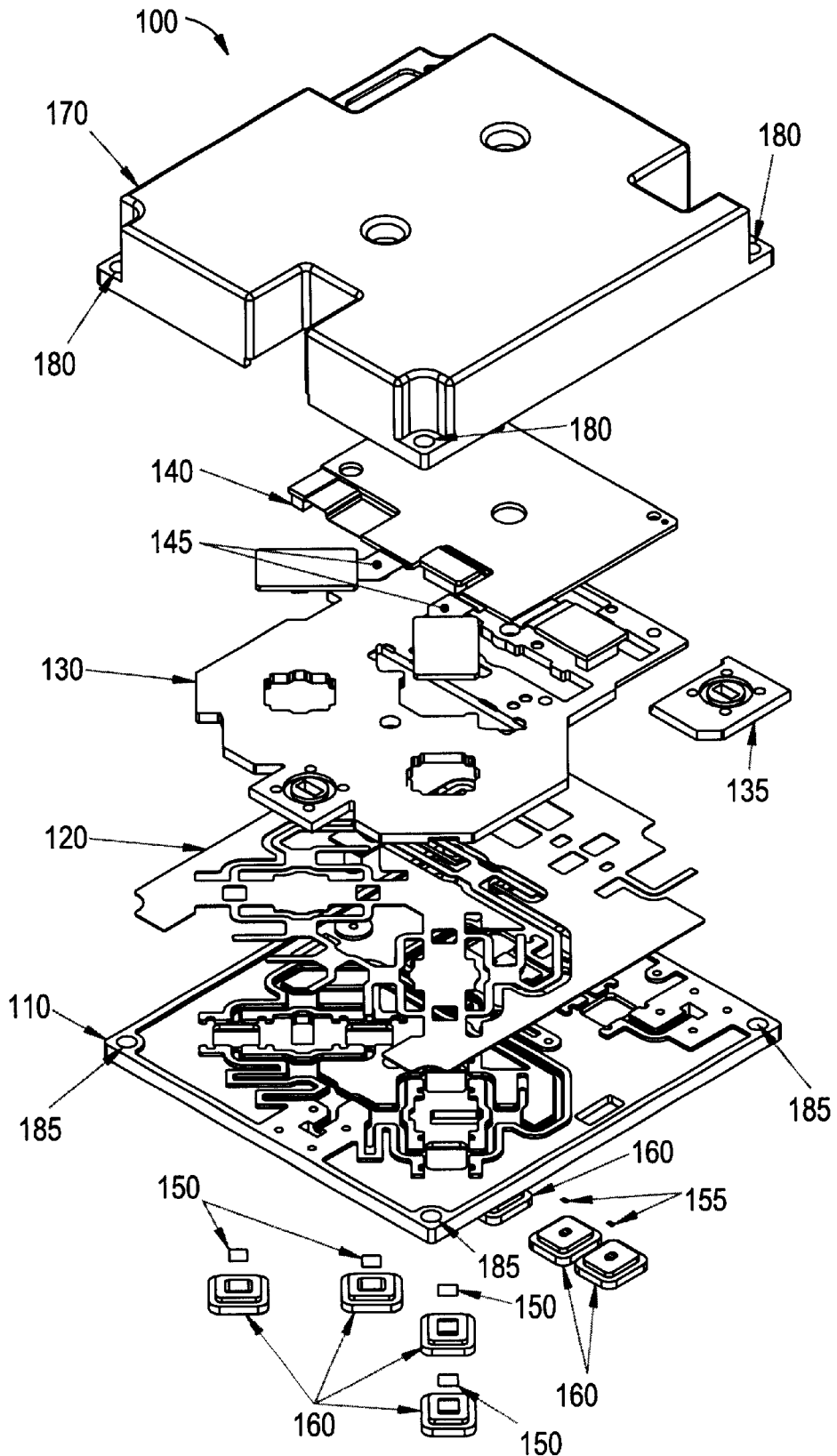
FIG. 1 illustrates a modular power amplifier in accordance with one embodiment of the invention.

FIG. 1 illustrates a power amplifier module 100 in accordance with one embodiment of the invention. Power amplifier 100 includes a RF board 120, a plurality of amplifiers 150, an RF cover 130 having an interlocking input 135, and a DC board 140. Additionally, power amplifier 100 may be a fully integrated structure having a top cover 170, a chassis 110, a plurality of driver amplifiers 155, and a plurality of pedestals 160.

DC board 140 preferably includes a rigid non-conducting, multi-layered dielectric substrate material including, but not limited to, fiberglass and polyimide. DC board 140 suitably includes trace lines to route DC to one or more bias points. Each bias point includes a connector plug-in point. For example, one end of a connector plug-in is suitably located on RF board 120 at a desired bias point and the mated end of the connector plug-in is located on DC board 140 such that when the two plug-in ends are brought together, a DC connection is made for routing DC to RF board 120. The size of DC board 140 varies depending upon the number of bias points on RF board 120.

DC board 140 promotes fast self-alignment of the connection points for easy "plug-in" and may also include any number of flexible interconnects 145. Flexible interconnect 145 allows movement between two rigid portions of DC board 140. This is particularly useful when matching (connecting) several bias points. DC board 140, in particular the plug-in design, facilitates fast assembly, disassembly, and maintenance of the power amplifier module.

The improved assembly of the power amplifier of the present invention permits the DC board to be integrated into a single module with the RF board. RF cover 130 provides suitable signal isolation between RF board 120 and DC board 140. The DC can be routed over the top of the RF in, for example, a daughter board configuration. This configuration eliminates the need for jumper wires extending from the DC board to the RF board. In addition, the "piggyback" power distribution topology (i.e., one board on top of the other) further reduces the overall size of the power amplifier. In one particular embodiment of the invention, the stand-alone power amplifier unit has dimensions on the order of 139.7×127×25.4 mm. Moreover, the DC board can be tested separately from the RF board. Thus, it can be determined prior to assembly if the board is in working condition. This results in a higher overall yield for the power amplifier module.

The DC board may further include a regulator and a switch (not shown). A single DC voltage is received at the DC board. The regulator conditions the DC voltage and controls the distribution of voltage to each individual component. The amount of bias is determined by the components on the RF board. Each individual component may require a different level of bias and the regulator suitably distributes the proper level.

An electronic switch turns the power amplifier on and off based on a signal received at the input connector. Generally, the switch, nearly simultaneously, turns each individual amplifier on and off at the same time as every other amplifier.

In one embodiment, DC board 140 is secured to the module via one or more plug-in connectors located on RF board 120 and one or more fixation devices. For example, fixation devices, such as screws, may attach DC board 140 to chassis 110. Securing the DC board helps to maintain the plug-in connectors positions. Additionally, securing the DC board to the chassis helps to ensure DC grounding.

RF cover 130 includes a metal material that suitably provides signal isolation between the DC and RF lines. RF cover 130 further provides a seal for many of the cavities of RF board 120. A conductive epoxy-like substance, such as silver epoxy, may be used to suitably bond RF cover 130 to the chassis. Preferably, the bond area promotes high RF conductivity, environmental protection (i.e., substantially free from dust and contaminants), and provides an EMI (electromagnetic interference) seal.

RF cover 130 includes an interlocking input 135 preferably made from the same material as cover 130. Interlocking input 135 suitably includes a waveguide for module RF input.

Interlocking input 135 is completely detachable from cover 130. RF cover 130 may be aligned atop RF board 120 and the waveguide port in chassis 110, and in particular, the RF output port and RF input port can be aligned separately. The two ports of RF cover 130 are substantially aligned with the corresponding ports on RF board 120 and the ports in chassis 110. Maintaining port-to-port alignment (i.e., RF input port on RF board 120 and in chassis 110 to RF input port on cover 130; RF output port on RF board 120 and chassis 110 to RF output port on cover 130) reduces RF loss. Each port-to-port alignment may be done separately to increase accuracy. Once the output ports are aligned, the input ports can be aligned using the moveable interlocking input 135.

In one embodiment, interlocking input 135 and the corresponding "locking" area of cover 130 are configured in a "tongue-and-groove" manner. For example, interlocking input 135 may suitably include a groove edge such that input 135 can easily be slipped over the matching tongue portion of cover 130. Input 135 can be moved along the tongue portion for aligning purposes. The input ports are aligned and the cover, including the interlocking input portion, is bonded in place.

RF board 120 includes a low loss substrate suitable for RF applications including, but not limited to, many teflon-based materials. RF board 120 suitably includes trace lines for routing RF amplifiers 150, 155. Amplifiers 150,155 are electrically connected to RF board 120 by, for example, wire bonding each amplifier to the trace lines.

In order to provide a good RF ground connection, RF board 120 may be epoxied to the chassis using an epoxy-like substance.

Amplifiers 150 may include any amplifier of preferably high gain and efficiency (e.g., DC to RF conversion). Preferably amplifiers 150 include the same or substantially the same type of amplifiers, as well as the same power output. MMIC amplifiers are particularly suited for power amplifier applications. Typically, MMICs are available as a pre-packaged device having a protective cover; thereby making handling of the MMIC easier during power amplifier assembly. While MMICs are conveniently described, various other amplifiers may be suited, such as amplifiers made from discrete FETs.

The number of amplifiers 150 is generally chosen as a power of 2 (i.e., $2^N$) due to the power combining network. Four ($2^2$) amplifiers 150 are illustrated in FIG. 1, however, the number of amplifiers, e.g., eight ($2^3$), sixteen ($2^4$), and so on, may be modified as needed to obtain the desired power output. While $2^{Nth}$ number of amplifiers is herein disclosed, the number and combinations may be varied for each particular application.

Top cover 170 includes a suitable metal material. Top cover 170 is particularly useful in isolating radiating signals, providing structural strength to the integrated module, and protecting the underlying components.

In one embodiment, top cover 170 is fitted by one or more posts extending from cover 170. The bottom outer edge of top cover 170 is bonded to a top outer edge of chassis 170 with a suitably epoxy-like substance; thereby encasing the inner layers to form an integrated substantially stand-alone power amplifier.

Top cover 170 may further include pilot holes 180 on the outer edge for inserting a fixation device, such as a screw, to be received in matching pilot holes 185 located on the outer edge of chassis 110.

Chassis 110 includes a metal material that is preferably easy to fabricate, provides grounding, thermal conductivity, mechanical support and integrity (e.g., aluminum). Holes are suitably drilled in chassis 110 in the areas where amplifiers 150 are to be mounted. Other areas may be suitably removed from chassis 110 that correspond to overlying components and boards, such as RF board 120.

Driver amplifiers 155 include any suitable gain devices typically coupled in series. In general, the number of individual amplifiers varies depending upon the desired gain of the power amplifier module. The signal input at the module can be a low power signal and the driver amplifiers suitably provide enough gain (i.e., increase (amplify) the signal) to the output amplifiers 150 to overcome any loss due to the splitter circuitry.

Pedestals 160 are included as needed to protect the amplifiers from mechanical overstress resulting from, for example, the mismatch in thermal expansion coefficient between the amplifier and the material of the chassis (e.g., aluminum). In cases where the material of the chassis matches or substantially matches the material of the amplifier, the need for a pedestal diminishes. Materials such as beryllium oxide, copper tungsten, and copper moly tend to match or substantially match the amplifier and may be used for the chassis. However, as available currently, these materials are expensive, heavy, and more difficult to machine than aluminum. Additionally, where the amplifier is attached with an epoxy-like, pedestals are generally not needed.

Each amplifier 150, 155 may be suitably bonded atop a pedestal 160. For example, the amplifier may be attached with an eutectic solder or some other method having low expansion modulus. For example, eutectic gold tin solder may be used to attach the amplifier, especially when high thermal and electrical conductivity are desired (e.g., amplifier 150). Driver amplifiers 155 tend to dissipate less energy and therefore may be attached with a suitable epoxy or epoxy-like substance and thus a pedestal may not be required.

In the case where pedestals are used, each pedestal 160, having an amplifier atop, may be fitted into a cutout portion of chassis 110. The pedestals may be bonded to the chassis using any suitable bonding material, such as an epoxy-like substance or eutectic solder.

Power amplifier 100 may further include a heat sink (not shown) of suitable material for providing thermal coupling. In one embodiment, a heat sink may be mounted to the bottom of chassis 110. The fixation device(s) inserted into pilot holes 180, 185 may attach the heat sink to power amplifier 100.

FIGS. 2 and 2a–2c illustrate a top view of a lower portion of an exemplary power amplifier structure 200 in accordance with the invention. Structure 200 includes an input 202, an output 204, a chassis 210, a RF board 220, a plurality of suspended strip line combiners 230, a plurality of loads 240, a plurality of output amplifiers 250, one or more driver amplifiers 255–257, a plurality of isolation components 260 and 265, and one or more DC connectors 270.

Typically, each output amplifier 250 is coupled to power splitter and combiner circuitry by, for example, etched transmission line technology. Etched transmission lines help to minimize phase variations between the amplifiers. Power loss associated with this circuitry is a function of the travel length (i.e., line length), thus it is advantageous to reduce the line length used for splitting and combining. The power level at the input (splitter circuitry) is low, so while reducing the input line length does help to decrease power loss, the power savings tends to be trivial. On the other hand, after the power gain from each of the amplifiers is added together and the DC power is invested, the output loss associated with the length of the combiner line can be significant. Thus, a small improvement in the amount of power loss associated with the output (combiner circuitry) can increase the overall efficiency of the power amplifier.

In the present embodiment, amplifiers 250 are suitably configured in an angled formation. By angling the amplifiers, the length of the lines, and in particular the output line, are considerably shorter. Reducing line lengths on the RF board helps to reduce the overall size of the power amplifier module, decrease output power losses, and increase overall system efficiency.

Another advantage of angling amplifiers 250 in the present configuration, is that each amplifier receives substantially the same level of airflow. Air typically flows orthogonal to either side of amplifier 100. Amplifiers 150 and 155 are configured such that a substantially even distribution of amplifiers over the area of the chassis results. This configuration helps to reduce "hot spots" (created when heat released from nearby devices is allowed to combine) and increase amplifier performance and reliability.

In one embodiment, system 200 includes four substantially identical 4 watt amplifiers 250, such as MMIC amplifiers. At an operating frequency of about 27 GHz, the power from each of the four MMIC amplifiers can be combined to obtain a high power output of about 14 watts. It should be appreciated that various other types and power output amplifiers may be implemented; operating frequencies may vary depending upon the application; and total power output of the power amplifier may vary depending upon the desired output, operating frequency, number and type of amplifier(s) used, and operating conditions. Additionally, the modular solid state power amplifier herein disclosed may be coupled with one or more similar power amplifiers; thereby resulting in a combined modular power amplifier system having an increased total power output.

Each driver amplifier 255 represents a gain block, where each gain block couples to another gain block in series. The first two driver amplifiers 255, 256 may be low power amplifiers. The final driver amplifier 257 may be a high power amplifier (e.g., the same type of amplifier as the output amplifiers 250) capable of supplying enough power to drive the four amplifiers 250. RF input 202 may be a low power input suitably received at first driver power amplifier 255. In the present embodiment, three drivers provide the desired power gain to drive amplifiers 250. However, it should be realized that the number of driver amplifiers and the amount of power output varies depending upon the desired gain of the module.

In the present embodiment, structure 200 includes suspended strip line combiners 230 in a quadrature configuration. Suspended stripline combiners 230 provide improved RF isolation and power handling capability between individual amplifiers 250, and reduced insertion loss and phase variations.

Typically in quadrature coupling configurations, one of the four legs includes a load to provide isolation between the two combining ports. The quality of the load is a fundamental part of the isolation. Any unbalanced signal gets suitably shunted over to the isolation port where the load is preferably matched to reduce reflection. During normal operation of the power amplifier, if one of the legs become inoperative, roughly half of the power from the defective leg can be rerouted to the isolation leg and the system can still function (although usually at a reduced performance).

Loads 240 of the present embodiment, may be comprised from a ferrite filled silicone rubber, or other suitable material having a high dielectric constant. Loads 240 are configured as suspended stripline loads designed to handle high power with reduced reflection loss.

In one embodiment, loads 240 are angled in two planes. In contrast, a conventional load includes a rectangular shape having four straight lined surfaces. An undesirable rapid impedance shift can occur, especially in high dielectric constant materials when the signal reaches a rectangular-shaped load. The angled load configuration of the present invention permits a gradual transition of the signal to the load, thereby effectively reducing the impedance shift.

In one aspect of the present embodiment, loads 240 are in a suspended stripline configuration which further helps to reduce the impedance shift. In addition, the suspended stripline configuration helps to increase attenuation per unit length.

As previously mentioned, loads 240 may comprise a ferrite filled silicone rubber. As those skilled in the art will recognize, a similar type material may be used to provide RF isolation around the DC bias injection points and mode suppression in the large cavities.

Typically in high current applications, isolation between the amplifier stages is desirable to prevent loop oscillations. System 200 includes DC isolation components 260 (capacitors) and 265 (ferrite chips). Capacitors 260 are suitably configured as bypass (shunt) capacitors and are mounted near amplifiers 250. Ferrite chips 265 (or similarly acting resistance) are configured for series isolation and are also suitably mounted near amplifiers 250. The number of capacitors and total capacitance, as well as the number of ferrite chips and resistance, varies depending upon the particular matching needs of each application.

DC connectors 270 suitably include the RF end of the DC connector plug-in. Each DC connector 270 may be considered a "bias point" however, as illustrated, the DC is suitably routed from the connector point 270 to the bias point(s) on each amplifier 250, 255. As previously disclosed, DC connectors 270 make up one end of a connector plug-in with the other plug-in end located on a DC board (e.g., DC board 140). The two plug-in ends are brought together and a DC connection is made for routing DC to RF board 120. Each DC connector 270 may further include various other components to aid in the receipt and distribution of the DC (e.g., bias resistors, routing circuitry, and the like).

Figures 2, 2A, 2B, 2C:
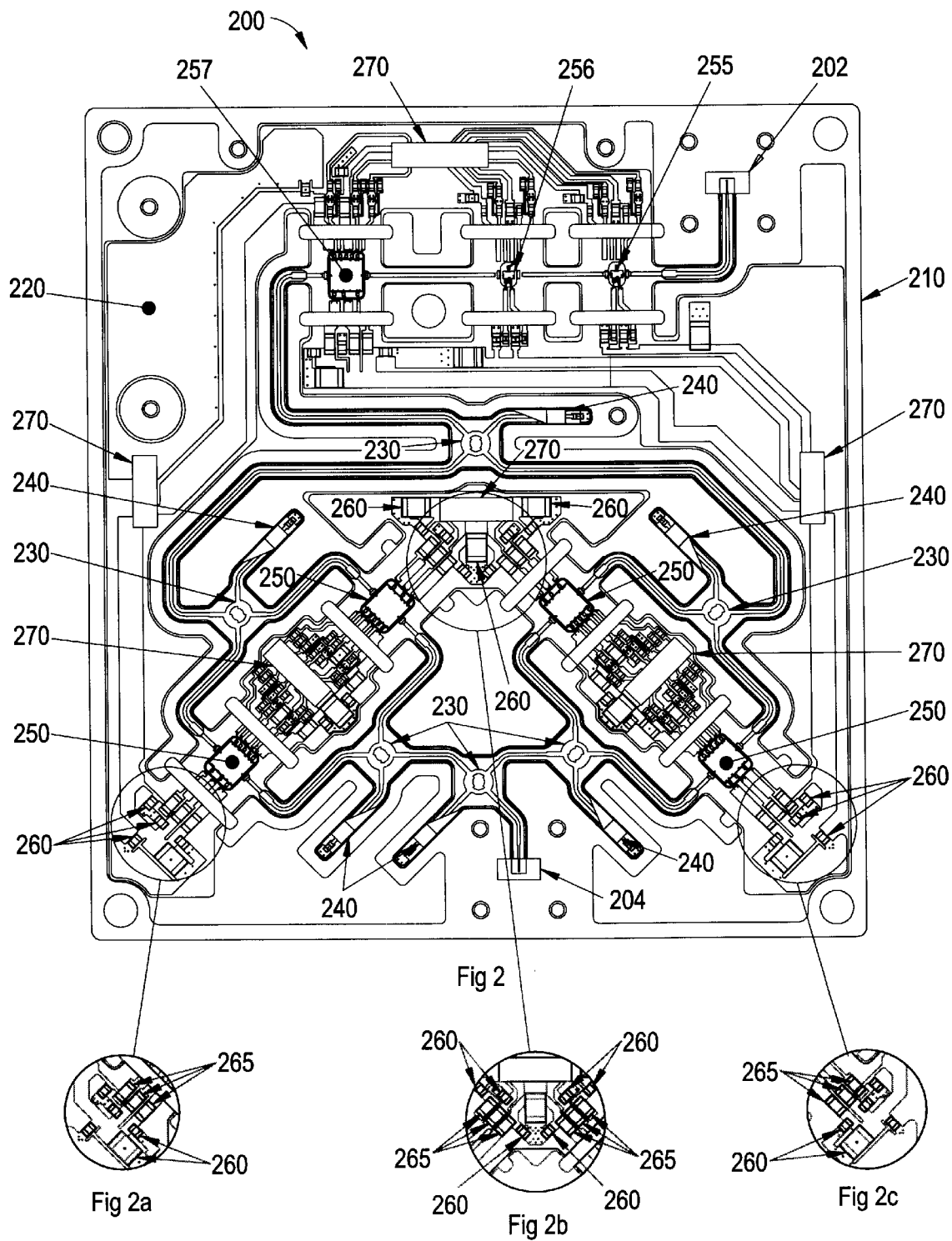
FIGS. 2 and 2a–2c illustrate the RF portion of a power amplifier in accordance with one embodiment of the invention.

As previously mentioned, a modular solid state power amplifier in accordance with the invention includes power splitter and combiner circuitry. With continued reference to FIG. 2, the various pathways of the splitter circuitry and the combiner circuitry are exemplified. It should be appreciated that FIG. 2 is merely one representation of a variety of possible circuitry layouts for routing the splitter and combiner circuitry.

Figure 3:
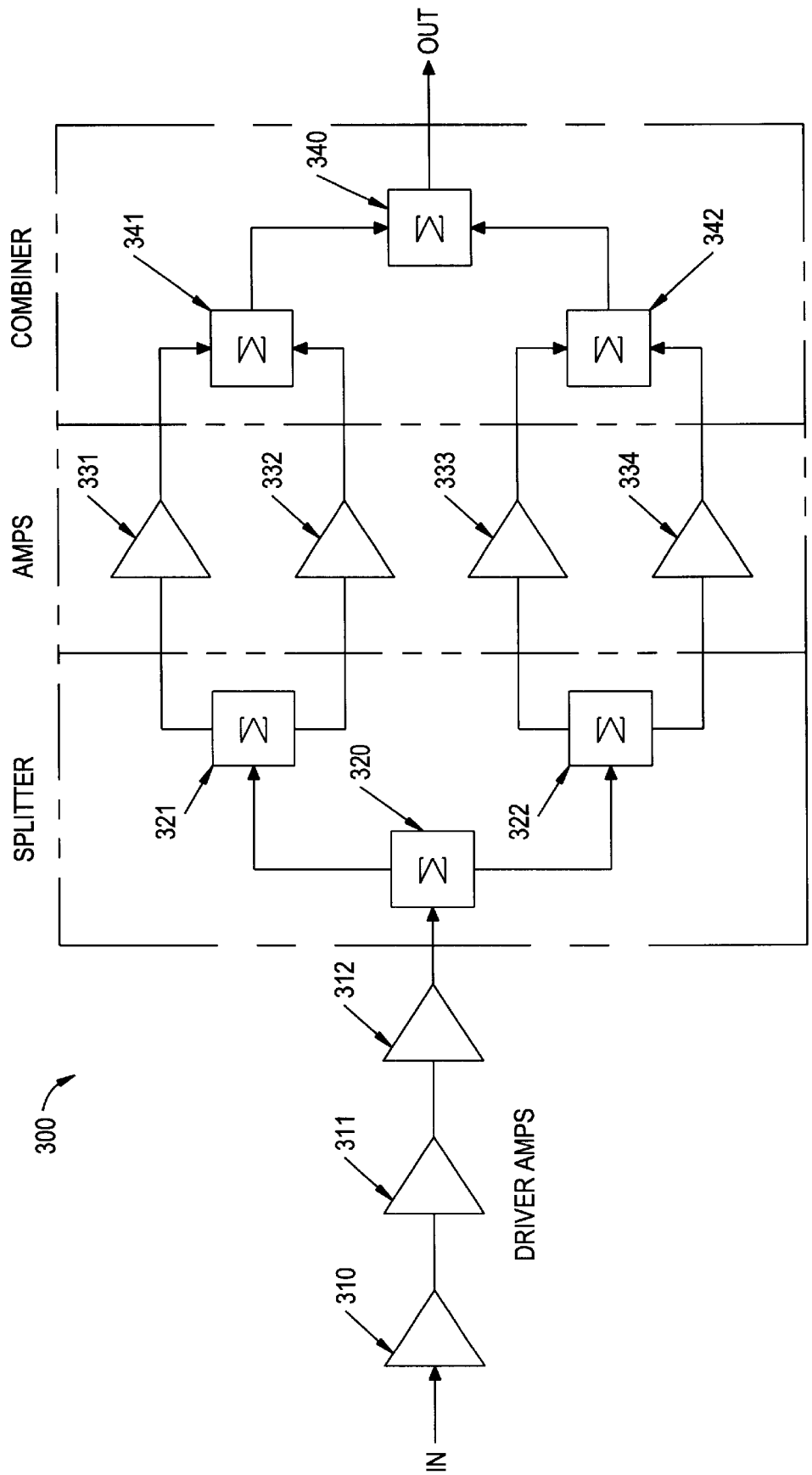
FIG. 3 illustrates a block diagram of a power amplifier in accordance with the invention.

Referring now to FIG. 3, a block diagram of a power amplifier system 300 in accordance with one embodiment of the invention is illustrated. System 300 includes driver amplifiers 310–312, splitter circuitry 320–322, output amplifiers 331–334, and combiner circuitry 340–342.

Driver amplifier 310 receives, amplifies, and then passes the RF input signal, which is typically a low power signal, to driver amplifier 311. Driver amplifier 311 also amplifies the signal and passes the signal to driver amplifier 312. Driver amplifier 312 further amplifies the signal to an appropriate gain level such that the amplified signal can now be divided into enough equal inputs to drive the output amplifiers. These steps may be carried out more or less times than three, depending on the amount of input signal gain desired.

Splitter circuitry 320 receives the amplified signal and suitably divides the signal into substantially equal inputs to be received at splitter circuitry 321, 322. Splitter circuitry 321 and 322 may be quadrature configurations, thereby providing signals to output amplifiers 331–332 and 333–334 respectively, at a 90° phase shift. For example, amplifier 331 receives substantially the same input signal as amplifier 332, however the signal is phase shifted 90°. Amplifier 333 receives substantially the same input signal as amplifier 334, however the signal is phase shifted 90°. In addition, amplifier pair 331, 332 is phase shifted 90° from amplifier pair 333, 334.

Output amplifiers 331–334 are preferably all the same type and power output. Each output amplifier provides a high gain (high output power) that is combined with the other amplifiers gain by the combiner circuitry.

Combiner 340 receives the combined output power from amplifier pair 331, 332 (via combiner 341) and the combined output power from amplifier pair 333, 334 (via combiner 342). Combiners 340, 341, 342 combine the power from the amplifiers in phase. Thus, at output combiner 340, the high power output is in phase.

It should be appreciated that the particular implementations shown and described herein are illustrative of various embodiments of the invention including its best mode, and are not intended to limit the scope of the present invention in any way. Indeed, for the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical communication system.

The present invention has been described above with reference to exemplary embodiments. However, those skilled in the art having read this disclosure will recognize that changes and modifications may be made to the embodiments without departing from the scope of the present invention. For example, various types of amplifiers may be included. These and other changes or modifications are intended to be included within the scope of the present invention, as expressed in the following claims.

What is claimed is:

1. An encased power amplifier having two outside ports, the power amplifier comprising:
    a moveable input coupled to one of the outside ports, the input configured for receiving a RF signal;
    at least one gain device electrically connected to the input;
    a DC board routing a DC signal to the gain device; and
    a DC isolation layer having an output coupled to the gain device and to the second outside port, the output configured for a RF signal, the DC isolation layer detachably coupled to the moveable input.

2. The power amplifier of claim 1, further comprising a DC connector having one section coupled to the DC board and a second section coupled to the amplifier, wherein the two sections form a DC connection.

3. The power amplifier of claim 1, wherein the DC board comprises a dielectric substrate material.

4. The power amplifier of claim 3, wherein the DC board comprises a rigid portion and a flexible portion.

5. The power amplifier of claim 1, comprising a piggyback power distribution topology.

6. The power amplifier of claim 1, further comprising a top cover and a chassis bonded together whereby encasing the power amplifier.

7. The power amplifier of claim 1, wherein the gain device comprises a MMIC amplifier.

8. The power amplifier of claim 1 comprising solid state components.

9. The power amplifier of claim 1 comprising four MMIC gain devices.

10. A solid state power amplifier useful in high power applications of at least 10 watts comprising:
   a DC component coupled to a plurality of gain devices;
   a RE component coupling the gain devices to a RE signal input and a RF signal output; and
   a network of combiner and splitter circuitry coupling the gain devices to the RE signal input and the RE signal output, the network including a plurality of loads having an angled shape and configured to reduce reflection loss.

11. The solid state power amplifier of claim 10 comprising an external volume not greater than 500 cm$^3$.

12. The solid state power amplifier of claim 10, wherein the network comprises suspended stripline combiners in a quadrature configuration.

13. The solid state power amplifier of claim 10, wherein the loads are configured to permit a gradual transition of an RE signal to the load.

14. The solid state power amplifier of claim 10, wherein the loads are in a suspended stripline configuration.

15. The solid state power amplifier of claim 10, wherein at least one of the gain devices is configured in an angled formation.

16. An encased solid state power amplifier having two outside ports, the power amplifier comprising:
   an RF signal input coupled to one of the outside ports;
   at least one gain device configured in an angled formation and electrically connected to the input;
   a DC board routing a DC signal to the gain device; and
   a DC isolation layer having an output coupled to the gain device and to the second outside port, the output configured for a RF signal and the RF signal input removably coupled to the DC isolation layer.

17. The power amplifier of claim 16 comprising a plurality of gain devices configured in the angled formation.

18. The power amplifier of claim 16 comprising four gain devices in a "V" formation.

19. A solid state high power amplifier comprising:
   a plurality of gain devices;
   an RF input port and an RF output port;
   a DC isolation layer having a network of power combiner and splitter circuitry, the network coupling the gain devices together and coupling the gain devices to the RF input port and to the RF output port, the network including a plurality of angled loads configured to reduce an impedance shift of an RF signal; and
   a DC component routing a bias to the gain devices.

20. The high power amplifier of claim 19 further comprising a top cover and a chassis bonded together to form a stand-alone unit, the unit having an input coupled to the RF input port and an output coupled to the RF output port.

21. A method of manufacturing a stand-alone high power solid state amplifier, the method comprising:
   (a) forming a DC component configured to route a bias to a plurality of gain devices;
   (b) forming a DC isolation component having a RF input configured to receive an RF signal and an RF output configured to output an RF signal and removably coupling the RF input to the DC isolation component;
   (c) forming a RF component configured to route the RF signal to the plurality of gain devices;
   (d) forming an angled pattern of the plurality of gain devices;
   (e) electrically coupling the gain devices such that a unified RF signal occurs at the RF output; and
   (f) forming a single unit by enclosing the RF and DC components with a signal shielding material.

22. The method of claim 21, wherein forming the DC component further comprises forming at least two rigid areas interconnected by a flexible area.

23. The method of claim 21, wherein forming the RF component comprises forming a network of combiner and splitter circuitry.

24. The method of claim 23, wherein forming the network comprises forming an angled load.

25. A method for amplifying an RF signal to at least 10 watts, the method comprising the steps of:
   (a) receiving the RF signal at an input port of a solid state amplifier;
   (b) increasing the RF signal to sufficiently power a plurality of angled MIMICs;
   (c) dividing the increased RF signal to provide substantially the same amount of power to each of the MIMICs;
   (d) combining an output power from each of the MIMICs in a suspended strip line quadrature configuration to obtain a unified RF signal output at an output port of the solid state amplifier, wherein the unified RF signal output is less than the sum of the combined output powers from the MIMICs; and
   (e) reducing the loss associated with step (d) by angling a load in the quadrature configuration.

26. A method for assembling a modular solid state amplifier having multiple gain devices, the method comprising:
   (a) bonding a low loss substrate having a plurality of RF trace lines to a metallic support, the RF trace lines coupled to a signal input port and a signal output port of the low loss substrate;
   (b) forming a bias connection point by positioning a semi-flexible dielectric board substantially atop the low loss substrate to join one half of a connector located on the semi-flexible dielectric board with a second half of the connector located on the low loss substrate, the semi-flexible dielectric board having a plurality of DC trace lines configured to route DC to the connection point;
   (c) substantially aligning a detachable signal input port of a signal isolation shield with the signal input port of the low loss substrate;
   (d) substantially aligning a signal output port of the signal isolation shield with the signal output port of the low loss substrate, wherein steps (c) and (d) may be carried out separately by moving the detachable signal input port;
   (e) coupling the gain devices to the connection point and the RF trace lines; and
   (f) bonding a metallic cover to the metallic support such that the low loss substrate, the semi-flexible dielectric board, the gain devices, and the signal isolation shield are enclosed.

* * * * *